(12) United States Patent
You et al.

(10) Patent No.: US 9,012,890 B2
(45) Date of Patent: Apr. 21, 2015

(54) ORGANIC LIGHT-EMITTING DISPLAY DEVICE AND MANUFACTURING METHOD OF THE SAME

(75) Inventors: Chun-Gi You, Yongin (KR); Joon-Hoo Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 815 days.

(21) Appl. No.: 13/080,444

(22) Filed: Apr. 5, 2011

(65) Prior Publication Data

US 2012/0007083 A1    Jan. 12, 2012

(30) Foreign Application Priority Data

Jul. 7, 2010    (KR) .................. 10-2010-0065459

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 27/12* | (2006.01) | |
| *H01L 51/52* | (2006.01) | |
| *H01L 29/66* | (2006.01) | |
| *H01L 29/417* | (2006.01) | |
| H01L 27/32 | (2006.01) | |

(52) U.S. Cl.
CPC .......... *H01L 27/124* (2013.01); *H01L 51/5296* (2013.01); *H01L 29/66757* (2013.01); *H01L 29/41733* (2013.01); H01L 27/3246 (2013.01); H01L 27/3248 (2013.01); *H01L 27/326* (2013.01); H01L 51/5265 (2013.01); H01L 51/5271 (2013.01); H01L 2227/323 (2013.01); H01L 27/1255 (2013.01)

(58) Field of Classification Search
CPC ................ H01L 29/41733; H01L 51/5296; H01L 29/66757
USPC ................................. 257/40, 59, 72
See application file for complete search history.

(56) References Cited

U.S. PATENT DOCUMENTS

| | | |
|---|---|---|
| 2003/0127652 A1 | 7/2003 | Park et al. |
| 2006/0163565 A1* | 7/2006 | Park et al. .......... 257/40 |
| 2007/0222370 A1* | 9/2007 | Zhu et al. .......... 313/504 |
| 2010/0193790 A1* | 8/2010 | Yeo et al. .......... 257/59 |

FOREIGN PATENT DOCUMENTS

| | | |
|---|---|---|
| JP | 2006-269329 A | 10/2006 |
| JP | 2006302748 A | 11/2006 |
| KR | 2003-0058911 A | 7/2003 |
| KR | 1020060079615 A | 7/2005 |

(Continued)

OTHER PUBLICATIONS

Registration Determination Certificate issued by the Korean Intellectual Property Office dated Sep. 4, 2012.

(Continued)

*Primary Examiner* — Phat X Cao
(74) *Attorney, Agent, or Firm* — Knobbe Martens Olson & Bear LLP

(57) ABSTRACT

An organic light-emitting display device and a method of manufacturing the organic light-emitting display device. A metal layer separated from a pixel electrode is formed without increasing the number of masks, thereby simplifying the pixel electrode and obtaining etching characteristics of a gate electrode.

8 Claims, 6 Drawing Sheets

(56) References Cited

FOREIGN PATENT DOCUMENTS

| KR | 10-2006-0007899 A | 1/2006 |
| KR | 1020060108790 A | 10/2006 |
| KR | 10-2008-0104324 A | 12/2008 |
| KR | 1020090120698 A | 11/2009 |
| KR | 10-0943187 B1 * | 2/2010 |

OTHER PUBLICATIONS

Official Action issued by the Korean Industrial Property Office dated Feb. 27, 2012 in Korean Patent Application No. 10-2010-0065459, 4 pages.

* cited by examiner

ORGANIC LIGHT-EMITTING DISPLAY DEVICE AND MANUFACTURING METHOD OF THE SAME

CROSS-REFERENCE TO RELATED APPLICATIONS

This application claims the benefit of Korean Patent Application No. 10-2010-0065459, filed on Jul. 7, 2010, in the Korean Intellectual Property Office, the disclosure of which is incorporated herein in its entirety by reference.

BACKGROUND

1. Field

The present embodiments relate to organic light-emitting display devices and methods of manufacturing the same, and more particularly, to organic light-emitting display devices and methods of manufacturing the same, wherein the manufacturing methods are simplified.

2. Description of the Related Technology

A flat panel display device such as an organic light-emitting display device, a liquid crystal display device, or the like is manufactured on a substrate, on which a pattern including a thin-film transistor (TFT) and a capacitor and a wiring connecting these, is formed.

In general, patterns having micro-structures including a TFT are formed on a substrate, on which a flat panel display device is to be manufactured, and the fine patterns are transferred to the substrate, e.g., an array substrate, by using a mask having these patterns.

Transfer of patterns using a mask is usually performed by using a photolithography process. In the photolithography process, a substrate, on which a pattern is to be formed, is uniformly coated with a photoresist, and the photoresist is exposed using an exposure equipment such as a stepper, and the photosensitized photoresist, if the photoresist is a positive photoresist, is developed. Also, after developing the photoresist, the pattern is etched by using a remaining photoresist as a mask, and unnecessary photoresist is removed.

In the above-described transfer process of transferring a pattern by using a mask, first, a mask having necessary patterns needs to be prepared, and thus the manufacturing costs for preparing a mask is increased as the number of processes using a mask is increased. Also, since the above-described complicated processes need to be conducted, the manufacturing method becomes complicated. In addition, the manufacturing time is increased, which also increases the manufacturing costs.

SUMMARY

One or more embodiments provide organic light-emitting display devices and methods of manufacturing the same, in which the number of patterning operations using a mask is reduced and organic light-emitting display devices having excellent display quality are manufactured.

According to an aspect of the present embodiments, there is provided an organic light-emitting display device comprising: a thin-film transistor (TFT) comprising a gate electrode, a source electrode, and a drain electrode; an organic light-emitting device that is electrically connected to the TFT, and in which a pixel electrode formed on the same layer as the gate electrode, an intermediate layer including an emissive layer, and an opposite electrode are sequentially stacked in the order stated; a storage capacitor comprising a bottom electrode and a top electrode that is formed on the same layer as the gate electrode; and a metal layer that is separated from the pixel electrode by an insulation layer formed below the pixel electrode, and that is formed on the entire surface of the substrate.

The gate electrode may comprise a first electrode comprising the same material as the pixel electrode and a second electrode formed on the first electrode.

The top electrode may comprise the same material as the pixel electrode.

The pixel electrode may be electrically connected to one of the source and drain electrodes.

The metal layer may comprise a single layer or a plurality of layers, and may comprise at least one selected from the group consisting of Ag, Mg, Al, Pt, Pd, Au, Ni, Nd, Ir, Cr, Li, Ca, Mo, Ti, W, MoW, LiF/Ca, LiF/Al, Al/Cu, Al/Nd, AlLiNa, ITO/Ag/ITO, ITO/Ag/IZO, ATD, and ITO/APC/ITO.

The bottom electrode may be formed on the same layer and comprises the same material as the active layer of the TFT.

According to another aspect of the present embodiments, there is provided a method of manufacturing an organic light-emitting display device, the method comprising: sequentially depositing a metal layer and a first insulation layer on a substrate in the order stated; a first mask operation of forming an active layer of a TFT and a capacitor bottom electrode on the first insulation layer; a second mask operation of forming electrode patterns for forming a capacitor gate electrode, a pixel electrode, and a capacitor top electrode on the active layer and the capacitor bottom electrode; a third mask operation of forming an interlayer insulation layer having an opening that exposes two sides of the active layer and a portion of each of the electrode patterns; a fourth mask operation of forming source and drain electrodes contacting the exposed two sides of the active layer, the pixel electrode, and the capacitor top electrode; and a fifth mask operation of forming a pixel define layer exposing the pixel electrode.

The second mask operation may comprise: sequentially depositing a second insulation layer, a first conductive layer, and a second conductive layer in the order stated on the active layer and the capacitor bottom electrode; and patterning the first conductive layer and the second conductive layer to form the gate electrode that comprises the first conductive layer as a first electrode and the second conductive electrode as a second electrode.

The third mask operation may comprise: depositing a third insulation layer on the gate electrode and the electrode patterns; and patterning the third insulation layer to form an opening that exposes a portion of the source and drain regions of the active layer and a portion of each of the electrode patterns.

The fourth mask operation may comprise: depositing a third conductive layer on the interlayer insulation layer; patterning the third insulation layer to form the source and drain electrodes; and removing the second conductive layer constituting the electrode patterns to form the pixel electrode and the capacitor top electrode that respectively use the first conductive layer as an electrode.

The fifth mask operation may comprise: depositing a fourth insulation layer on the entire surface of the substrate; and patterning the fourth insulation layer to form the pixel define layer.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
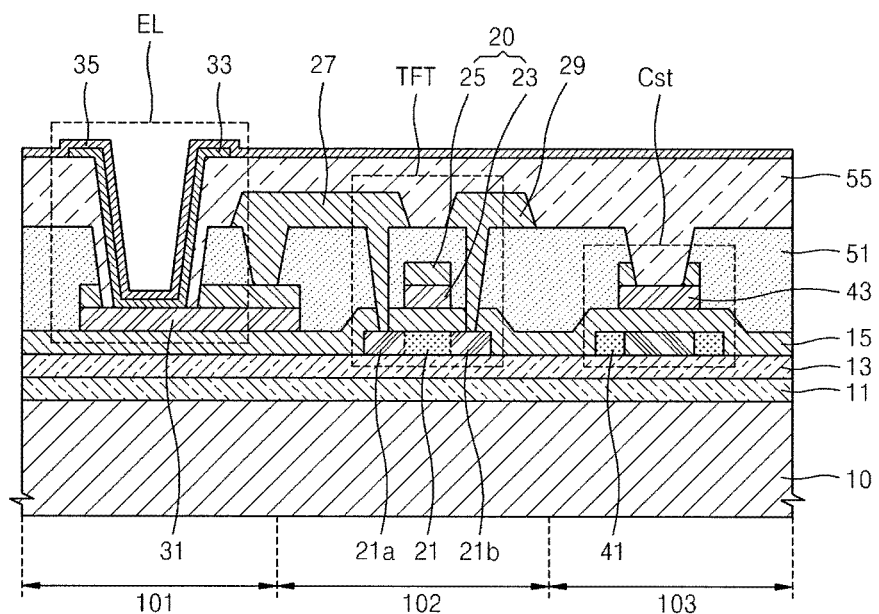
FIG. 1 is a cross-sectional view illustrating a portion of an organic light-emitting display device, according to an embodiment.

The present embodiments will now be described more fully with reference to the accompanying drawings, in which example embodiments are shown. Like reference numerals in the drawings denote like elements. In the description of the present embodiments, certain detailed explanations of related art are omitted when it is deemed that they may unnecessarily obscure the essence of the present embodiments.

In the drawings, the thicknesses of layers and regions are exaggerated for clarity.

It will be understood that when a component such as a layer, a region, or a substrate is referred to as being "on" another component throughout the specification, it can be directly "on" the other component, or intervening layers may also be present.

FIG. 1 is a cross-sectional view illustrating a portion of an organic light-emitting display device, according to an embodiment.

Referring to FIG. 1, the organic light-emitting display device includes a light-emitting region 101, a channel region 102, and a storage region 103.

In the channel region 102, a thin-film transistor (TFT) is formed as a driving device. The TFT comprises an active layer 21, a gate electrode 20, and a source and drain electrode 27 and 29. The gate electrode 20 comprises a gate bottom electrode 23 and a gate top electrode 25, and the gate bottom electrode 23 comprises a transparent conductive material. A gate insulation layer 15 is interposed between the gate electrode 20 and the active layer 21 to insulate the gate electrode 20 and the active layer 21. Also, source and drain regions 21a and 21b, which are highly doped with impurities, are formed at two boundary regions of the active layer 21, and are connected to the source and drain electrodes 27 and 29, respectively.

An organic light-emitting device EL is formed in the light-emitting region 101. The organic light-emitting device EL includes a pixel electrode 31 connected to one of the source and drain electrodes 27 and 29 of the TFT, an opposite electrode 35, and an intermediate layer 33 interposed between the pixel electrode 31 and the opposite electrode 35. The pixel electrode 31 comprises a transparent conductive material, and is formed at the same time as the gate electrode 20 of the TFT.

A storage capacitor Cst is formed in the storage region 103. The storage capacitor Cst comprises a bottom electrode 41 and a top electrode 43, and the gate insulation layer 15 is interposed between the bottom electrode 41 and the top electrode 43. The top electrode 43 is formed at the same time as the gate electrode 20 of the TFT and the pixel electrode 31 of the organic light-emitting device EL.

A metal layer 11 is formed over the whole substrate 10 including the light-emitting region 101, the channel region 102, and the storage region 103. The metal layer 11 functions as a reflection layer to form resonance of the organic light-emitting device EL, and may have a single-layer structure or a multi-layer structure. A first insulation layer 13 and the gate insulation layer 15 are formed between the metal layer 11 and the pixel electrode 31, and thus the metal layer 11 is spaced apart from the pixel electrode 31, and is formed over the entire surface of the substrate 10 without patterning.

As the metal layer 11 is formed over the entire surface of the substrate 10 without an additional patterning process, the bottom emission type light emitting display device according to the current embodiment may be manufactured by performing a mask process about five times. Also, the metal layer 11 is separated from the pixel electrode 31. Accordingly, as a reflection layer is formed under the pixel electrode 31, light extraction efficiency is increased. Also, when forming the gate electrode 20 at the same time as the pixel electrode 31, there is no need to form the gate electrode 20 with a multi-layer structure of at least three layers for coupling between the pixel electrode 31 and the reflection layer, and thus etching characteristics of the gate electrode 20 may be obtained.

FIGS. 2 through 11 are cross-sectional views illustrating a manufacturing method of a bottom emission type organic light-emitting display device according to an embodiment.

Figure 2:
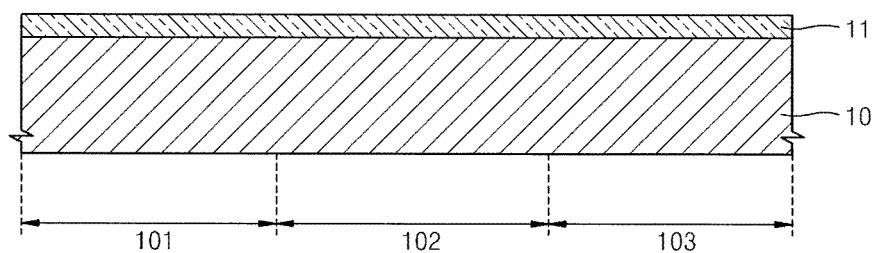
FIGS. 2 through 11 are cross-sectional views illustrating a manufacturing method of a bottom emission type organic light-emitting display device according to an embodiment.

Referring to FIG. 2, a metal layer 11 is formed on a substrate 10.

The substrate 10 may comprise a transparent glass material containing $SiO_2$ as a major component. However, the substrate 10 is not limited thereto, and may comprise various types of substrates such as a transparent plastic material or a metal. Although not shown in FIG. 2, a buffer layer may be additionally formed between the substrate 10 and the metal layer 11 to planarize the substrate 10 and to prevent penetration of impurity elements into the substrate 10.

The metal layer 11 having a single layer structure or a multi-layer structure may be formed on the substrate 10. The metal layer 11 may comprise at least one of Ag, Mg, Al, Pt, Pd, Au, Ni, Nd, Ir, Cr, Li, Ca, Mo, Ti, W, MoW, LiF/Ca, LiF/Al, Al/Cu, Al/Nd, AlLiNa, indium tin oxide (ITO)/Ag/ITO, ITO/Ag/indium zinc oxide (IZO), ATD (ITO/Ag alloy /ITO), and ITO/APC (Ag—Pd—Cu alloy)/ITO. The metal layer 11 may be deposited using various deposition methods such as a plasma-enhanced chemical vapor deposition (PECVD), an atmospheric pressure CVD (APCVD) method, and a low-pressure CVD (LPCVD) method.

Figure 3:
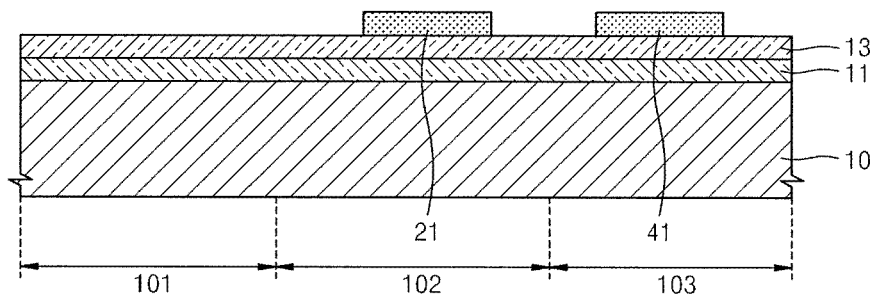

Referring to FIG. 3, an active layer 21 of a TFT and a bottom electrode 41 of a storage capacitor Cst may be formed on the metal layer 11.

The first insulation layer 13, such as a barrier layer and/or buffer layer, may be formed on the metal layer 11 to prevent diffusion of impurity ions and penetration of water or external air and to planarize a surface of the metal layer 11. The first insulation layer 13 may be deposited by using $SiO_2$ and/or $SiN_x$ and various methods such as a PECVD method, an APCVD method, a LPCVD method, or the like.

Amorphous silicon is first deposited on the first insulation layer 13 and then crystallized to form a polycrystalline silicon layer (not shown). The amorphous silicon may be crystallized using various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method or the like.

As described above, the polycrystalline silicon layer is patterned into the active layer 21 of the TFT and the bottom electrode 41 of the capacitor Cst, hereinafter referred to as the capacitor bottom electrode 41, by using a mask process using a first mask (not shown).

According to the current embodiment, the active layer 21 and the capacitor bottom electrode 41 are separated, but they may also be formed as a single unit.

Figure 4:
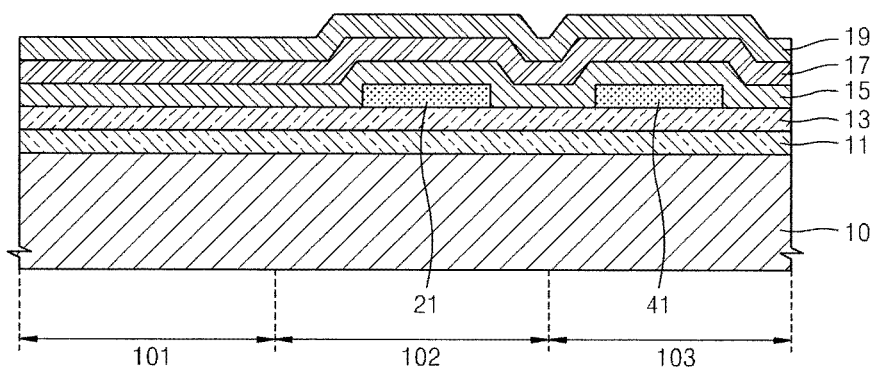

Referring to FIG. 4, a second insulation layer 15, a first conductive layer 17, and a second conductive layer 19 are sequentially deposited in the order stated on the entire surface of the substrate 10 on which the active layer 21 and the capacitor bottom electrode 41 are formed.

The second insulation layer 15 may be deposited as an inorganic insulation layer such as SiNx or SiOx and by using a method such as a PECVD method, an APCVD method, a LPCVD method, or the like. The second insulation layer 15 is interposed between the active layer 21 and a gate electrode 20 of the TFT to function as a gate insulation layer of the TFT, and is also interposed between a capacitor top electrode 43 and the capacitor bottom electrode 41 to function as a dielectric layer of the capacitor Cst.

The first conductive layer 17 may include at least one transparent material selected from the group consisting of ITO, IZO, ZnO, and $In_2O_3$. Later, the first conductive layer 17 is patterned into a pixel electrode 31, a gate bottom electrode 23, and a capacitor top electrode 43.

The second conductive layer 19 may include at least one selected from the group consisting of Ag, Mg, Al, Pt, Pd, Au, Ni, Nd, Ir, Cr, Li, Ca, Mo, Ti, W, MoW, and Al/Cu. Later, the second conductive layer 19 is patterned into a gate top electrode 25.

Figure 5:
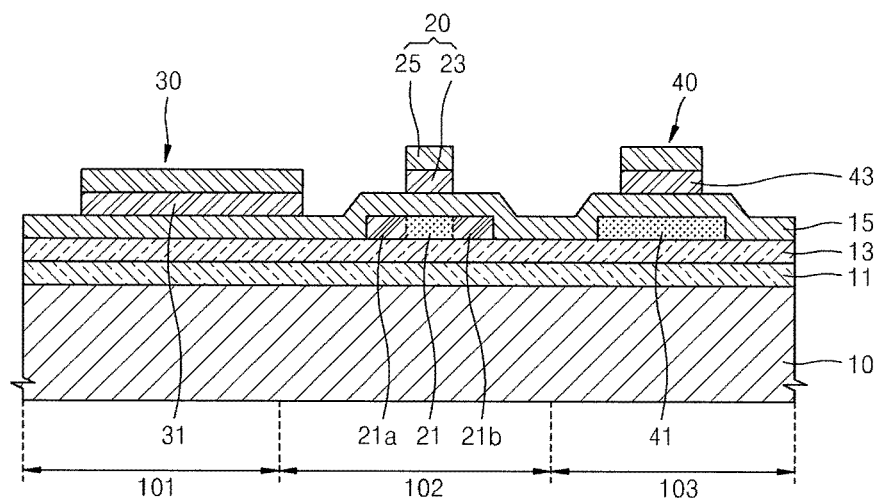

Referring to FIG. 5, a gate electrode 20 and electrode patterns 30 and 40 are formed on the substrate 10.

The first conductive layer 17 and the second conductive layer 19, sequentially stacked on the entire surface of the substrate 10, are patterned by using a mask process using a second mask (not shown).

In the channel region 102, the gate electrode 20 is formed on the active layer 21, and the gate electrode 20 includes a the gate bottom electrode 23 that is formed from a portion of the first conductive layer 17 and the gate top electrode 25 that is formed from a portion of the second conductive layer 19.

In the light-emitting region 101, the electrode pattern 30 is formed, which is used to form a pixel electrode later, and in the storage region 103, the electrode pattern 40 is formed on the capacitor bottom electrode 41, which is used to form the capacitor top electrode 43 later.

The gate electrode 20 corresponds to a center portion of the active layer 21, and the active layer 21 is doped with n-type or p-type impurities by using the gate electrode 20 as a mask so as to form source and drain regions 21a and 21b on boundaries of the active layer 21 corresponding to two sides of the gate electrode 20 and a channel region between the source and drain regions 21a and 21b.

Figure 6:
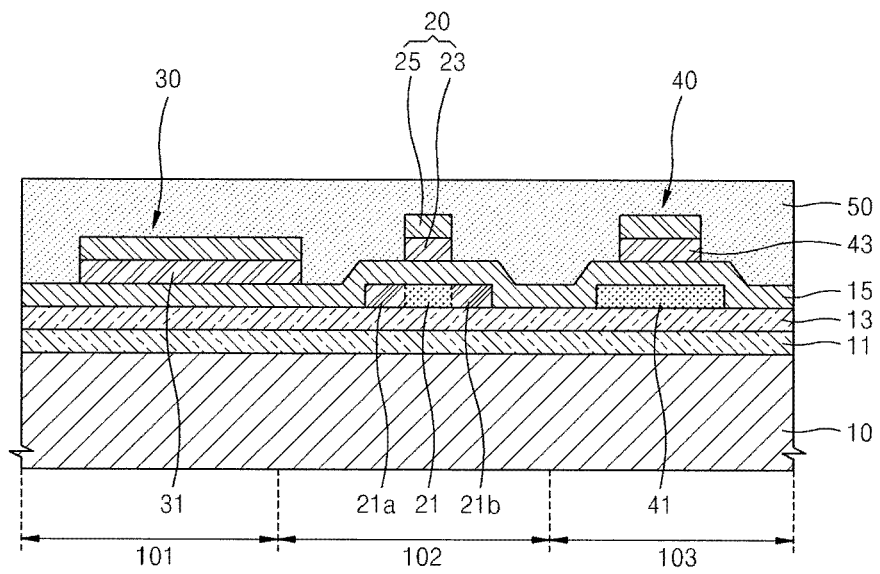

Referring to FIG. 6, a third insulation layer 50 is deposited on the entire surface of the substrate 10 on which the gate electrode 20 is formed.

The third insulation layer 50 is formed by using at least one organic insulation material selected from the group consisting of polyimide, polyamide, an acrylic resin, benzocyclobutene, and a phenolic resin, and by using a method such as a spin coating method. The third insulation layer 50 is formed to have a sufficient thickness, for example, to be thicker than the above-described second insulation layer 15, and functions as an intermediate insulation layer between the gate electrode 20 and the source and drain electrodes 27 and 29 of the TFT. Also, the third insulation layer 50 may comprise not only the organic insulation material but also of an inorganic insulation material, like the second insulation layer 15, or may be formed by alternately stacking organic insulation materials and inorganic insulation materials.

Figure 7:
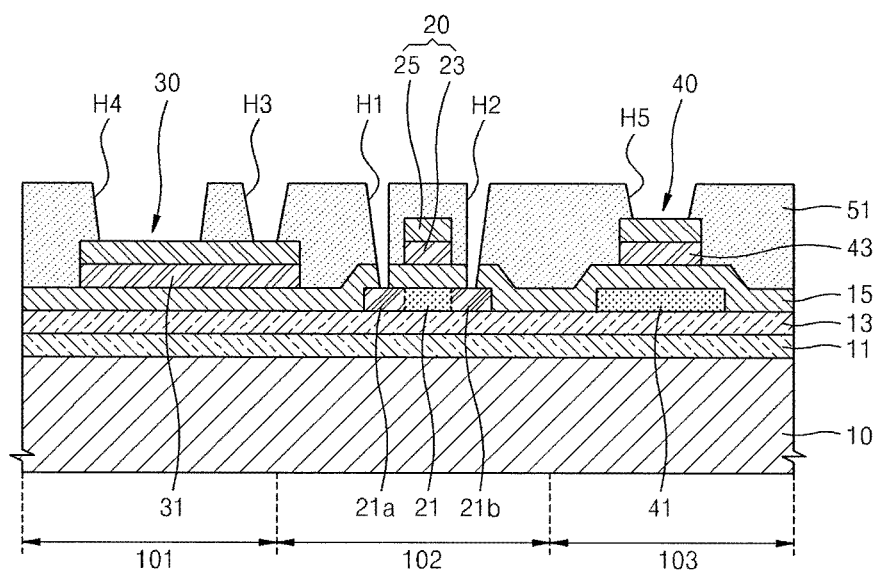

Referring to FIG. 7, an interlayer insulation layer 51 having openings H1, H2, H3, H4, and H5 that expose portions of the electrode patterns 30 and 40 and the source and drain regions 21a and 21b is formed.

The third insulating layer 50 is patterned using a mask process using a third mask (not shown) to form the openings H1, H2, H3, H4, and H5.

The openings H1 and H2 expose a portion of the source and drain regions 21a and 21b, and the openings H3 and H4 expose a portion of the second conductive layer 19 constituting an upper portion of the electrode pattern 30, and the opening H5 exposes a portion of the second conductive layer 19 constituting an upper portion of the electrode pattern 40.

Figure 8:
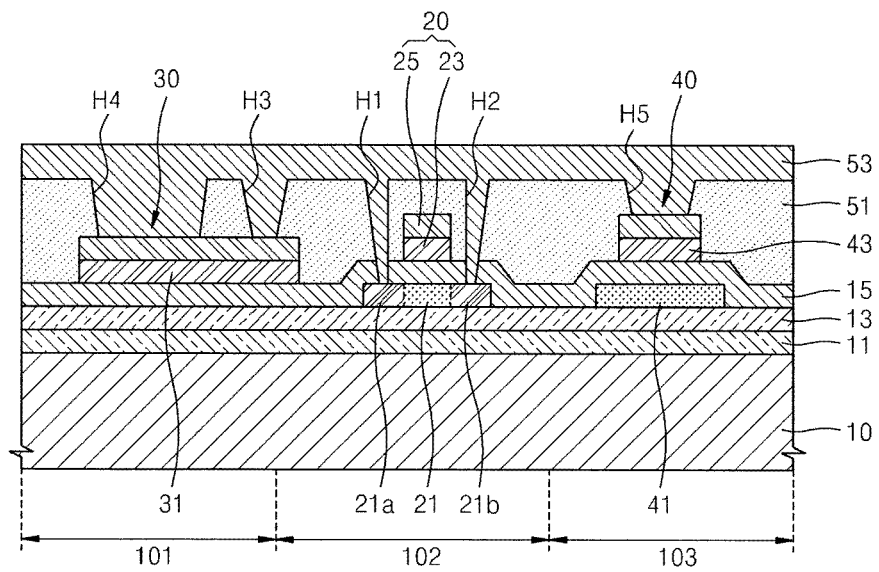

Referring to FIG. 8, a third conductive layer 53 covering the interlayer insulation layer 51 is formed on the entire surface of the substrate 10.

The third conductive layer 53 may comprise the same conductive material as that of the above-described first or second conductive layer 17 or 19, and is not limited thereto and may comprise various conductive materials. Also, the conductive material is deposited to have a sufficient thickness so as to fill the openings H1, H2, H3, H4, and H5.

Figure 9:
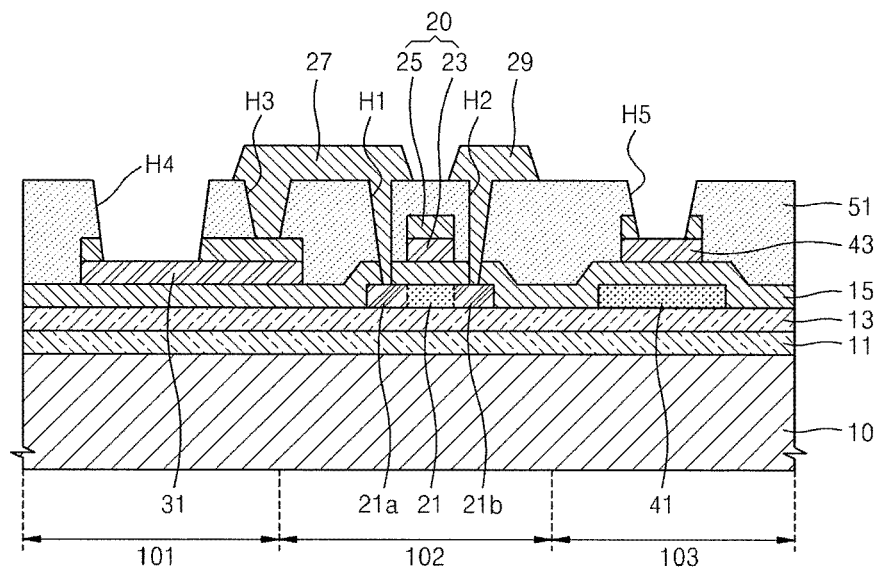

Referring to FIG. 9, source and drain electrodes 27 and 29, a pixel electrode 31, and a capacitor top electrode 43 are formed.

The third conductive layer 53 is patterned using a mask process using a fourth mask (not shown) to form the source and drain electrodes 27 and 29.

One of the source and drain electrodes 27 and 29 is formed so as to be connected to the pixel electrode 31 via the opening H3 at the boundary region of the second conductive layer 19 on the electrode pattern 30, on which the pixel electrode 31 is to be formed.

After forming the source and drain electrodes 27 and 29, the pixel electrode 31 and the capacitor top electrode 43 are formed by further etching the second conductive layer 19.

A portion of the second conductive layer 19 of the electrode pattern 30 that is exposed via the opening H4 is removed to form the pixel electrode 31.

A portion of the second conductive layer 19 of the electrode pattern 40 that is exposed via the opening H5 is removed to form the capacitor top electrode 43.

Accordingly, the pixel electrode 31, the gate bottom electrode 23, the capacitor top electrode 43 are formed on the same layer and of the same material.

Figure 10:
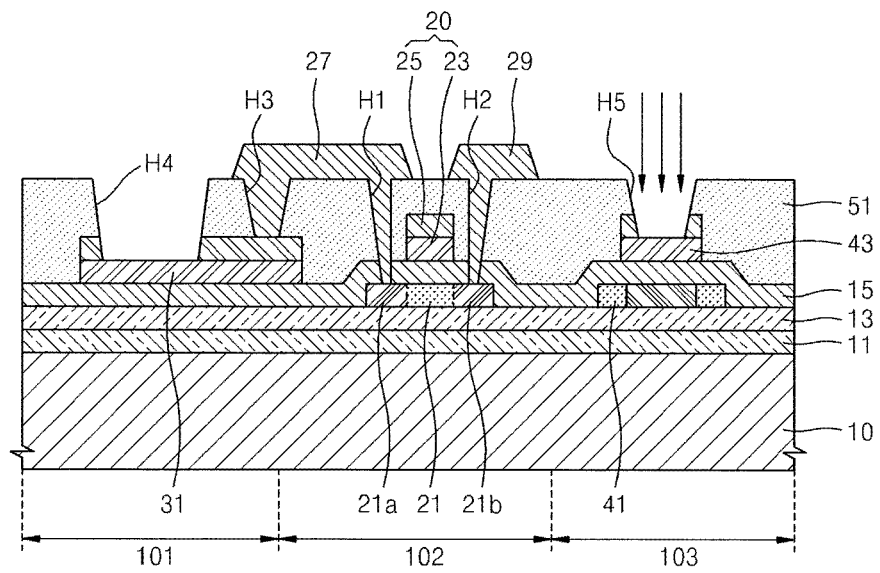

Referring to FIG. 10, the capacitor bottom electrode 41 is doped by injecting n-type or p-type impurities into the capacitor top electrode 41 via the opening H5. The impurities to be implanted may be the same as or different from that used when doping the active layer 21.

Figure 11:
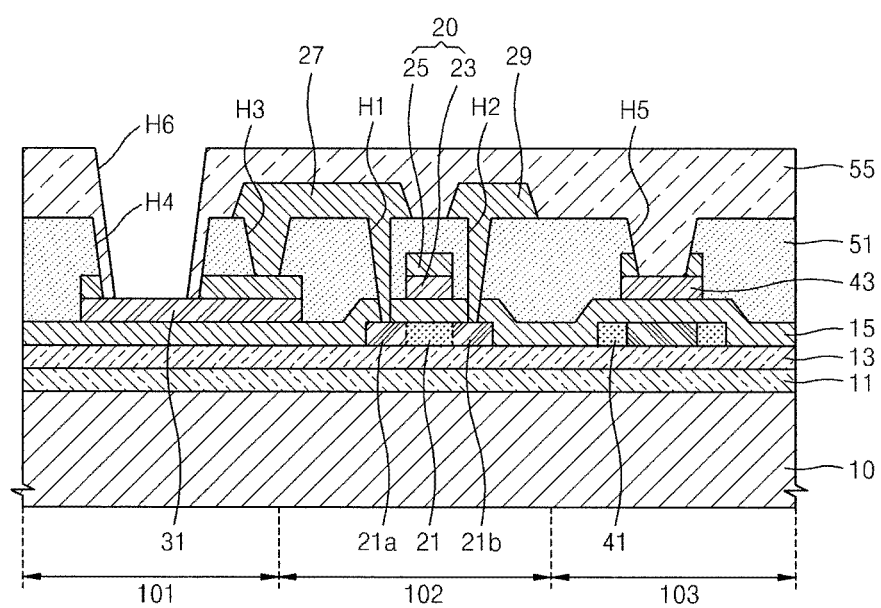

Referring to FIG. 11, a pixel define layer (PDL) 55 is formed on the substrate 10.

A fourth insulation layer (not shown) is deposited on the entire surface of the substrate 10 on which the pixel electrode 31, the source and drain electrodes 27 and 29, and the top electrode 43 are formed.

The fourth insulation layer may comprise at least one organic insulation material selected from the group consisting of polyimide, polyamide, an acrylic resin, benzocyclobutene, and a phenolic resin and by using method such as a spin coating method. The fourth insulation layer is not limited thereto, and may also comprise an inorganic insulation material selected from the group consisting of $SiO_2$, $SiN_x$, $Al_2O_3$, $CuO_x$, $Tb_4O_7$, $Y_2O_3$, $Nb_2O_5$, and $Pr_2O_3$. Also, the fourth insulation layer may be formed to have a multilayer structure in which organic insulation layers and inorganic insulation layers are alternately stacked.

The fourth insulation layer is patterned by using a mask process using a fifth mask (not shown) so as to expose a center portion of the pixel electrode 31, and accordingly, the PDL 55 is formed.

Then, as illustrated in FIG. 1, an intermediate layer 33 including an organic emissive layer and an opposite electrode 35 are formed in an opening H6 exposing the pixel electrode 31.

The intermediate layer 33 may comprise at least one functional layer selected from the group consisting of an organic emissive layer (EML), a hole transport layer (HTL), a hole injection layer (HIL), an electron transport layer (ETL), and an electron injection layer (EIL), in a single-layer or multi-layer structure.

The intermediate layer 33 may comprise low-molecular weight or polymer organic materials.

When the intermediate layer 33 comprises a low-molecular weight organic material, the intermediate layer 33 may include a HTL and a HIL that are stacked toward the pixel electrode 31, and an ETL and an EIL stacked toward the opposite electrode 35. The intermediate layer 33 may also include other various layers according to necessity. Examples of the low-molecular weight organic material include copper phthalocyanine (CuPc), N,N'-Di(naphthalene-1-yl)-N,N'-diphenyl-benzidine (NPB), and tris-8-hydroxyquinoline aluminum)(Alq3).

When formed of a polymer organic material, the intermediate layer 33 may include only a HTL layer toward the pixel electrode 31 with respect to the EML. The HTL may be formed on the pixel electrode 31 by using an inkjet printing method or a spin coating method by using poly-(2,4)-ethylene-dihydroxy thiophene (PEDOT), polyaniline (PANI), or the like. Examples of the polymer organic material include polyphenylenevinylene (PPV)-based or polyfluorene-based polymer organic materials, and a color pattern may be formed by using a method such as an inkjet printing method, a spin coating method, or a thermal transfer method using a laser.

The opposite electrode 35 may be formed on the entire surface of the substrate 10 as a common electrode. In the organic light-emitting display device according to the current embodiment, the pixel electrode 31 is used as an anode electrode, and the opposite electrode 35 is used as a cathode electrode. However, the polarities of the electrodes may also be interchanged.

When the organic light-emitting display device is a bottom emission type in which an image is formed toward the substrate 10, the pixel electrode 31 is used as a transparent electrode, and the opposite electrode 35 is used as a reflective electrode. The reflective electrode may be formed by depositing a metal having a low work function, for example, Ag, Mg, Al, Pt, Pd, Au, Ni, Nd, Ir, Cr, Li, Ca, LiF/Ca, LiF/Al or a compound of these to have a thin thickness.

Although not shown, an encapsulation member (not shown) or an absorbent (not shown) may be further formed on the opposite electrode 35 to protect the EML from water or oxygen from the outside.

In each mask process of the manufacturing method of the above-described organic light-emitting display device, the stacked layers may be removed by using a dry etching method or a wet etching method.

In the bottom emission type organic light-emitting display device according to the current embodiment, a metal layer is formed in the lowermost portion of a substrate to be spaced apart from a pixel electrode so as to increase a light emitting efficiency of the pixel electrode and to obtain etching characteristics of a gate electrode. Accordingly, a display quality of the display device is increased, and the manufacturing method may be simplified and defects may be decreased.

In the above-described embodiments, an organic light-emitting display device is described as an example of a display device, but the present embodiments are not limited thereto, and various display devices such as a liquid crystal display may be used as the display device.

Also, in the drawings, only one TFT and one capacitor are illustrated; however the present embodiments are not limited thereto, and without increasing the number of mask processes according to the embodiment described above, a plurality of TFTs and a plurality of capacitors may be included.

According to the present embodiments, a metal layer is disposed under a pixel electrode to be separated from the pixel electrode without increasing the number of masks, and is used to function as a reflection layer of the pixel electrode. Accordingly, the pixel electrode may be simplified and etching characteristics of a gate electrode may be obtained.

Accordingly, by reducing the number of masks, the manufacturing costs may be reduced and the manufacturing process may be simplified, and decrease in the yield which may be caused when the pixel electrode and the reflection layer are coupled may be prevented.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light-emitting display device comprising:
a thin-film transistor (TFT) comprising an active layer, a gate electrode, a source electrode, and a drain electrode;
an organic light-emitting device electrically connected to the TFT, in which a pixel electrode formed at the same layer as the gate electrode, an intermediate layer including an emissive layer, and an opposite electrode are sequentially stacked in the order stated;
a storage capacitor comprising a bottom electrode and a top electrode formed at the same layer as the gate electrode; and
a metal layer separated from the pixel electrode by an insulation layer formed below the pixel electrode, and formed on the entire surface of the substrate, as a reflection layer to form resonance of the organic light-emitting device;
wherein a first conductive layer is on an edge of the pixel electrode and an edge of the top electrode of the storage capacitor by patterning the first conductive layer to have an opening, and the first conductive layer directly contacts the edge of the top electrode of the storage capacitor, and
wherein a second conductive layer contacts the first conductive layer on the pixel electrode through a contact hole and is connected to one of the source and drain electrodes, and the source and drain electrodes directly contact the active layer through contact holes.

2. The organic light-emitting display device of claim 1, wherein the gate electrode comprises a first electrode comprising the same material as the pixel electrode and a second electrode formed on the first electrode.

3. The organic light-emitting display device of claim 1, wherein the top electrode comprises the same material as the pixel electrode.

4. The organic light-emitting display device of claim 1, wherein the pixel electrode is electrically connected to one of the source and drain electrodes.

5. The organic light-emitting display device of claim 1, wherein the metal layer comprises a single layer.

6. The organic light-emitting display device of claim 1, wherein the metal layer comprises multiple layers.

7. The organic light-emitting display device of claim 1, wherein the metal layer comprises at least one selected from the group consisting of Ag, Mg, Al, Pt, Pd, Au, Ni, Nd, Ir, Cr, Li, Ca, Mo, Ti, W, MoW, LiF/Ca, LiF/Al, Al/Cu, Al/Nd, AlLiNa, ITO/Ag/ITO, ITO/Ag/IZO, ATD, and ITO/APC/ITO.

8. The organic light-emitting display device of claim 1, wherein the bottom electrode is formed at the same layer and comprises the same material as the active layer of the TFT.

\* \* \* \* \*